United States Patent [19]
Simms et al.

[11] 3,790,411
[45] Feb. 5, 1974

[54] METHOD FOR DOPING SEMICONDUCTOR BODIES BY NEUTRAL PARTICLE IMPLANTATION

[75] Inventors: Douglas Leon Simms, East Orange; Norman Henry Tolk, Mendham; Clark Woody White, Dover, all of N.J.

[73] Assignee: Bell Telephone Laboratories, Incorporated, Murray Hill, N.J.

[22] Filed: Mar. 8, 1972

[21] Appl. No.: 232,771

[52] U.S. Cl. ............ 148/1.5, 250/41.3, 250/49.5 T, 317/235 AY, 317/235 B
[51] Int. Cl. .............................................. H01l 7/54
[58] Field of Search ..... 148/1.5; 317/235; 250/41.3, 250/49.5 T

[56] References Cited

UNITED STATES PATENTS

| | | | |
|---|---|---|---|
| 3,388,009 | 6/1968 | King | 148/1.5 |
| 3,472,751 | 10/1969 | King | 204/192 |
| 3,657,542 | 4/1972 | Futch, Jr. et al. | 250/41.3 X |
| 3,328,210 | 6/1967 | McCaldin et al. | 148/1.5 |
| 3,472,712 | 10/1969 | Bower | 148/187 |
| 3,555,332 | 1/1971 | Schroeder et al. | 313/63 |

*Primary Examiner*—Hyland Bizot
*Assistant Examiner*—J. Davis
*Attorney, Agent, or Firm*—J. C. Fox

[57] ABSTRACT

Doping of semiconductor bodies is achieved by bombarding the surface of the semiconductor with a beam of neutral particles to implant particles therein.

1 Claim, 2 Drawing Figures

METHOD FOR DOPING SEMICONDUCTOR BODIES BY NEUTRAL PARTICLE IMPLANTATION

BACKGROUND OF THE INVENTION

This invention relates to the fabrication of semiconductor devices and integrated circuits by the implantation of neutral particles therein, such as to form buried layers or regions of significant impurities. Significant impurities are those which control conductivity, minority carrier lifetime, etc.

In order to dope semiconductors with conductivity type determining impurities, the diffusion of impurities into the semiconductor through openings in suitable masks has been widely practiced. Such techniques typically involve complex, time-consuming multiple steps to form the required masks, and are dependent upon the forces of thermal equilibrium for the determination of concentration level and gradient of dopant attained. These limitations in large part served as the impetus for the development of ion implantation techniques, whereby instead of drifting into the lattice structure of the semiconductor body randomly by diffusion, ions can be made to enter the lattice at a fixed direction and velocity to the desired location with more precision. Furthermore, species of relatively low diffusion constants such as, for example, nitrogen may readily be implanted, leading to minimization of drift during subsequent fabrication steps carried out at elevated temperatures.

There are, however, certain disadvantages inherent in doping by ion implantation, which are particularly apparent in the doping of semiconductor bodies having insulating coatings thereon. It is common to fabricate semiconductor devices by forming a coating of the oxide of the semiconductor material on the body and using the coating not only as a mask in fabrication but also as a permanent protective film left in situ to prevent contamination. The metal-oxide-semiconductor field effect transistors (MOSFET), for example, may be fabricated by oxidizing the surface of an n-type semiconductor, depositing a metal gate on the oxide layer, and forming p-type source and drain regions under the oxide on either side of gate by ion implantation. Such a fabrication technique is described in U.S. Pat. No. 3,472,712. Ion implantation through such an insulating layer, however, leads to charge buildup on the layer and on the gate, causing a multiplicity of problems including: repulsive forces which reduce the energy of the particles, and thus their penetration depth; dielectric breakdown or rupture of the insulating layer, particularly in the channel region under the gate where charge buildup is highest, leading to shorting of the gate to the channel; and detrimental effects on device operating characteristics due to accumulation of mobile carriers in the insulating layer. Therefore, it would be desirable to have a direct and simple method for doping of semiconductors which substantially avoids the above difficulties.

SUMMARY OF THE INVENTION

Doping of semiconductor bodies by bombardment of the surface with a neutral particle beam substantially retains the advantages of ion implantation over diffusion doping, while substantially avoiding the difficulties inherent in the use of charged particles for implantation.

In a preferred embodiment, an ion beam of the dopant species is first formed, focused and accelerated to the desired energy, and then at least partially neutralized by charge exchange with a gas. The non-neutralized portion is then deflected from the beam path so that substantially only neutrals impact the target surface.

DETAILED DESCRIPTION OF THE INVENTION

Figure 1:
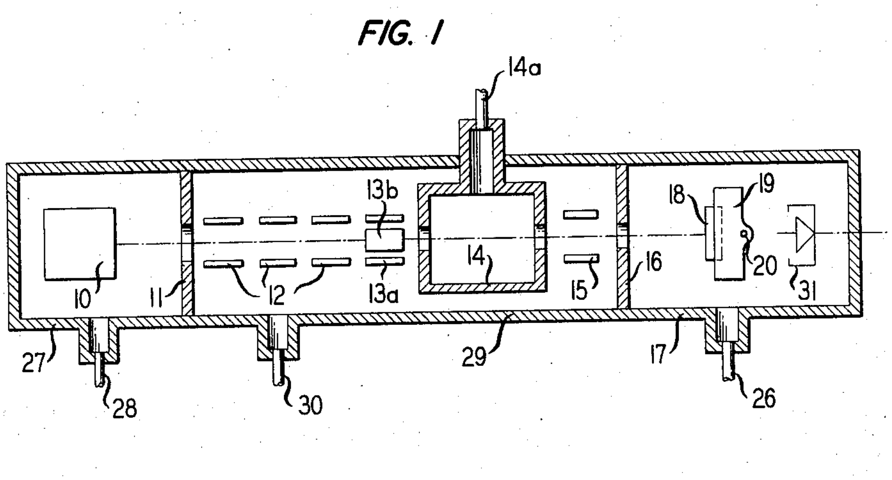
FIG. 1 is a section view of one embodiment of an apparatus suitable for carrying out the invention.

Referring now to FIG. 1 there is shown one embodiment of the inventive apparatus in which ion source 10 provides ions, apertured partition 11 collects the ions, ion lenses 12 accelerate the ions to the desired energy while also focusing the ions into an ion beam and directing the beam through *x-y* deflector plates 13, charge exchange chamber 14 and deflector plates 15, and through apertured partition 16 into collision chamber 17 containing the target 18 to be implanted. It is advantageous to chemically clean the target surface by methods known in the art just prior to implantation.

Production of ions may be by any technique known in the art such as electron impact ionization.

Ion acceleration determines the beam energy, which determines penetration depth, as is known. The acceleration step will in general produce ions having energies of between 10 and 100 kilovolts, typically around 50 kilovolts. The energies may be even higher than 100 kilovolts, depending on the desired penetration depth.

X-y deflection plates 13 may be used, if desired, to achieve patterned implantation of the target by writing upon it with the beam. Alternatively, selective implantation may be achieved by use of well-known masking techniques.

The charge exchange chamber 14 and deflecting plates 15 are used to form a neutral particle beam, wherein a portion of the ion beam is neutralized by charge exchange with a gas admitted to chamber 14 through port 14*a*, and the non-neutralized portion is deflected from the beam path by plates 15. The efficiency of this charge exchange is dependent upon the density of the gas and the cross-section for the reaction. Ordinarily, where the gas is of the same species as the beam species, the cross-section is optimum. It is preferred to adjust the gas density so as to achieve a neutralization rate of 20 to 30 percent, below which the efficiency is too low to be practical, and above which the probability of secondary collisions is significant. Such charge exchange ordinarily involves little momentum transfer and thus has a negligible effect upon the energy and path of the particles. A more complete description of charge transfer processes, while not a necessary part of this description, may be found in *Physics of Atomic Collisions*, J. B. Hasted, Butterworth and Company (Publishers) Ltd., 1964, Chapter 12.

The vacuum enclosure may be evacuated of undesired impurities. Collision chamber 17 may be evacuated through port 26, while chambers 27 and 29 are evacuated through ports 28 and 30. If desired, the target may also be cleaned further in situ after the chambers have been evacuated.

The sample 18 is secured within a recessed portion of sample support 19. The angular relation of the sample to the beam may be adjusted by pivoting support 19 about rod 20. With chamber 14 evacuated, Faraday cup 31 may be used to measure ion beam intensity by swinging sample support 19 out of the beam path. Neutral beam intensity may be measured by replacing cup 31 with a bolometer or by a technique described in copending application Ser. No. 232,864, filed Mar. 8, 1972 and assigned to the present assignee.

The target may be maintained at a uniformly elevated temperature, typically between 400° and 900° C during and for a time after bombardment, as is known in the art, to repair any damage to the crystal lattice caused during implantation and to permit the implanted particles to take on substitutional lattice positions. Such annealing may alternatively be carried out after bombardment, if desired. Preferred annealing conditions are from 500° to 600° C for from 10 to 20 minutes, which are generally much lower than those necessary for undesired diffusion to occur.

Figure 2:
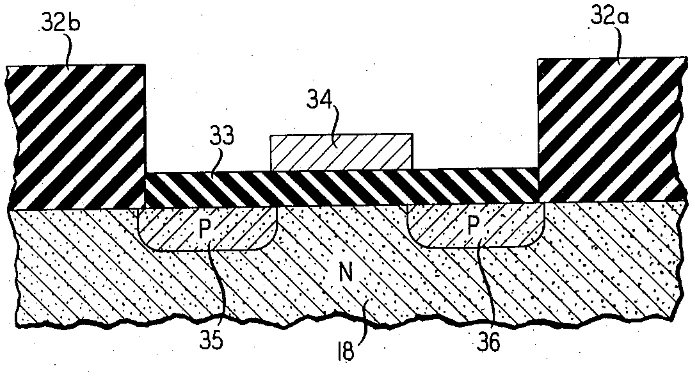
FIG. 2 is a section view of a MOSFET device containing source and drain regions produced in accordance with the invention.

Referring now to FIG. 2, there is shown one embodiment of a MOSFET structure having implanted source and drain regions according to the invention. N-type semiconductor body 18 supports thick oxide layer 32*a* and 32*b*, a portion of which has been removed. A thin oxide layer 33 is then formed on body 18 between portions 32*a* and 32*b*. Using masking techniques, metal gate 34 is formed on oxide layer 33 as shown. Gate 34 may be of silicon, aluminum, molybdenum, tungsten, or other suitable metal, as is known. P-type source and drain regions 35 and 36, respectively, are then formed by neutral particle implantation of suitable p-type impurities, as described above.

What is claimed is:

1. A method for doping semiconductor bodies by neutral particle implantation comprising forming a beam of dopant ions, neutralizing the charge on a portion of the ions by a partial charge exchange with a gas, and deflecting the non-neutralized ions from the beam prior to impingement of the beam on a semiconductor body.

* * * * *